(12) United States Patent
Wong et al.

(10) Patent No.: US 7,354,862 B2
(45) Date of Patent: Apr. 8, 2008

(54) THIN PASSIVATION LAYER ON 3D DEVICES

(75) Inventors: Lawrence Wong, Beaverton, OR (US); Grant Kloster, Lake Oswego, OR (US); Lawrence Foley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 11/109,241

(22) Filed: Apr. 18, 2005

(65) Prior Publication Data

US 2006/0234473 A1    Oct. 19, 2006

(51) Int. Cl.
*H01L 21/302* (2006.01)
(52) U.S. Cl. .................................... 438/692
(58) Field of Classification Search ........... 438/478, 438/184, 193, 195–198, 200–203, 206–207, 438/209–211, 218, 237, 165, 294, 308, 337, 438/353, 6, 10, 104, 107–114, 118, 121–123, 438/128–129, 135, 142, 145, 149, 151, 157, 438/176
See application file for complete search history.

(56) References Cited

U.S. PATENT DOCUMENTS

| | | | | |
|---|---|---|---|---|
| 5,627,106 A | * | 5/1997 | Hsu | 438/459 |
| 6,168,873 B1 | * | 1/2001 | Ikeda et al. | 428/621 |
| 6,432,811 B1 | | 8/2002 | Wong | |
| 6,596,640 B1 | * | 7/2003 | Fishcer et al. | 438/692 |
| 2003/0186535 A1 | | 10/2003 | Wong et al. | |
| 2005/0025942 A1 | | 2/2005 | Fischer et al. | |

* cited by examiner

*Primary Examiner*—Michael Lebentritt
*Assistant Examiner*—Andre' Stevenson
(74) *Attorney, Agent, or Firm*—Blakely, Sokoloff, Taylor & Zafman LLP

(57) ABSTRACT

Embodiments of the invention include a device with stacked substrates. Conducting interconnecting structures of one substrate are bonded to conducting interconnecting structures of another substrate. A passivating layer may be on the conducting interconnecting structures between the substrates and may be formed by an atomic layer deposition process or a with a Langmuir-Blodgett technique.

7 Claims, 7 Drawing Sheets

THIN PASSIVATION LAYER ON 3D DEVICES

BACKGROUND OF THE INVENTION

Increasingly complex electronic systems require increasingly denser structures of integrated circuits, passive components, and other discrete elements. Typical two-dimensional structures, where the elements are laid out on a printed circuit board or similar structure are beginning to not meet the performance requirements of advanced electronic systems. Hence, three-dimensional structures are being used to provide the needed levels of electronic circuit integration. These three-dimensional structures generally comprise multiple layers of devices along with multiple layers of interconnects to provide electrical connections between the devices.

One approach for providing interconnects in a multiple layer structure is to bond semiconductor devices formed on a substrate (e.g., a first substrate) to semiconductor devices from another substrate (e.g., a second substrate). Such bonding can continue for several layers and expand vertically. Bonding typically occurs between a conductor on the first substrate to another conductor on the second substrate.

Such conductors may diffuse into dielectric material on one of the substrates, oxidize after the bonding of the two wafers together, and this may result in degraded line resistance, electromigration performance, line-line shorting through diffusion of the conductive metallization layers, and reduced device reliability.

DETAILED DESCRIPTION

Figure 1:
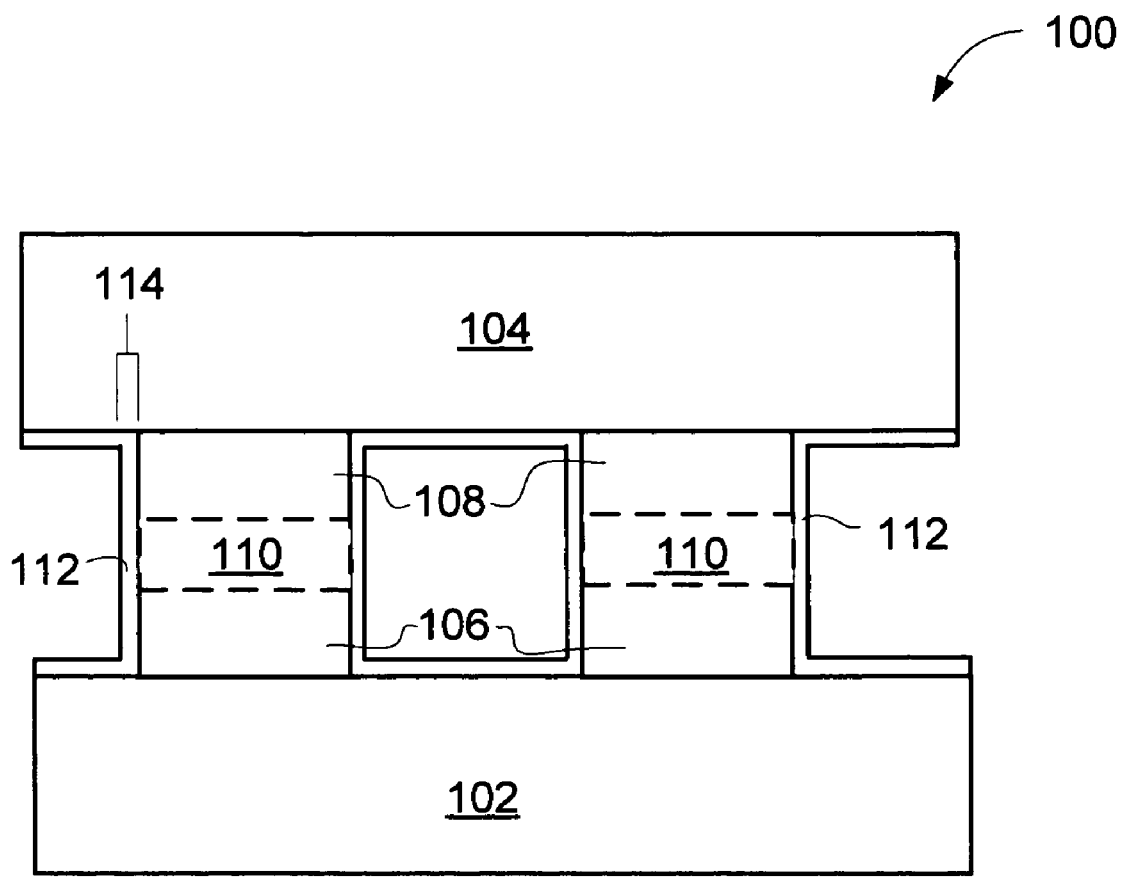
FIG. 1 is a cross sectional side view hat illustrates a stacked integrated circuit according to one embodiment of the present invention.

In various embodiments, an apparatus and method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The exemplary embodiments of the present invention pertain to bonding at least two substrates having devices patterned thereon to each other. The substrates are typically semiconductor substrates or wafers made of semiconductor material such as monocrystalline silicon wafers, polycrystalline silicon, silicon on insulator (SOI) substrates, or gallium arsenide. The substrates may include passive and/or active devices formed therein such as transistors, capacitors, resistors, diffused junctions, gate electrodes, local interconnects, etc . . . One or both of the substrates may be a chip or die, such as a microprocessor chip, or may be a wafer with multiple such chips or dies. In addition, the substrate includes one or more conductive interconnecting structures. In one embodiment, a passivating layer is formed over the conductive interconnecting structures. The passivating layer may completely cover all exposed areas of the conductive interconnecting structures in some embodiments. In some embodiments, subsequent processing of the passivating layer may be removed and leave the top surfaces of the conductive interconnecting structures exposed.

The two substrates may be bonded together by a bonding between conductive interconnecting structures from one substrate to conductive interconnecting structures from the other substrate. In one embodiment, the conductive interconnecting structures from one substrate are bonded directly to the conductive interconnecting structures from the other substrate. The conductive interconnecting structures thus interconnect the devices from one substrate to other devices from the other substrate. The conductive interconnecting structures also function to bond the two substrates together. It is to be noted that the bonding can be performed several substrates to create a multi-layer structure.

FIG. 1 is a cross sectional side view that illustrates a stacked integrated circuit 100 according to one embodiment of the present invention. The stacked integrated circuit 100 may include a first substrate 102. The first substrate 102 may include a layer of silicon, monocrystalline silicon, SOI, gallium arsenide, or other material. The substrate 102 may include one or more active/passive electronic device(s) formed therein. For example, the substrate 102 may include a transistor, capacitor, resistor, diffused junction, gate electrode, local interconnect, and etc . . . , that can be formed into the substrate 102. These devices may be formed in a device layer. The substrate 102 may also include one or more layers of dielectric material and conductors on the one or more device(s). Such dielectric material may be interlayer dielectric layers, and the conductors may provide connections to the device(s) in the device layer of the substrate 102. Thus, in some embodiments, the substrate 102 may be an integrated circuit, a chip or a die, such as a microprocessor or other device.

The first substrate 102 may include one or more conductive interconnecting structures 106. In some embodiments, the conductive interconnecting structures 106 may be copper pillars that extend above a top surface of the rest of the first substrate 102. The conductive interconnecting structures 106 may be cobalt, tungsten, titanium, aluminum, chromium, nickel, silver, gold, copper, cobalt alloy, tungsten alloy, titanium alloy, aluminum alloy, aluminum alloy, chromium alloy, nickel alloy, silver alloy, gold alloy, copper alloy, or other materials in other embodiments. In other embodiments, the conductors 106 may be located differently, be different shapes, and/or made from different materials.

A second substrate 104 may be bonded to the first substrate 102. The second substrate 104 may be similar to the first substrate 102, and may be an integrated circuit that includes one or multiple layers, which may include patterned materials and devices in various embodiments. The second substrate 104 may have one or more conductive interconnecting structures 108 that extend from the second substrate 104. These conductors 108 may be similar to the conductive interconnecting structures 106 of the first substrate 102.

The conductive interconnecting structures 106 of the first substrate 102 may be bonded to the conductive interconnecting structures 108 of the second substrate 104. This bond may connect the first and second device substrates 102, 104 structurally and/or electrically. There may be a bonded region 110 where the conductive interconnecting structures 106 of the first substrate 102 are bonded to the conductive interconnecting structures 108 of the second substrate 104. In some embodiments, the bonding of the conducting interconnecting structures 106, 108 may have resulted in the lack of a sharp or easily discernable boundary between conducting interconnecting structures 106 and conducting interconnecting structures 108, or even in a lack of a discernable boundary altogether. For example, diffusional creep caused by thermo compression bonding may partially or substantially completely erase any boundary between the conducting interconnecting structures 106, 108, or make the boundary not as clear as it was prior to bonding of the conducting interconnecting structures 106, 108. Thus, the bonding region 110 may include portions of conducting interconnecting structures 106, 108, and the boundary between the two structures 106, 108 may be clearly defined, or may be less defined.

There may be a passivating layer 112 on the conducting interconnecting structures 106, 108. The passivating layer 112 may substantially cover the surfaces of the conducting interconnecting structures 106, 108 that extend between the first and second substrates 102, 104. The passivating layer 112 may substantially prevent the surfaces of the conducting interconnecting structures 106, 108 from being exposed in the distance between the first and second substrates 102, 104. The passivating layer 112 may also act as a diffusion barrier to prevent diffusion of material of the conducting interconnecting structures 106, 108. The passivating layer 112 may have a thickness 114. In an embodiment, the thickness 114 of the passivating layer 112 may be less than about 50 angstroms. In another embodiment, the thickness 114 of the passivating layer 112 may be less than about 30 angstroms. In another embodiment, the thickness 114 of the passivating layer 112 may be less than about 20 angstroms. In some embodiments, the thickness 114 of the passivating layer 112 may as small as possible while still achieving good coverage of the surfaces of the conducting interconnecting structures 106, 108 between the first and second substrates 102, 104. In an embodiment, passivating layer 112 may have a thickness 114 that is thin enough to allow the conducting interconnecting structures 106, 108 to make electrical contact through the passivating layer 112 when the conducting interconnecting structures 106, 108 are bonded together.

In an embodiment, the passivating layer 112 may be formed by an atomic layer deposition (ALD) process, a plasma enhanced atomic layer deposition process (PEALD), or another process. The passivating layers 112 formed by an ALD process may be an oxide or nitride film, such as aluminum oxide, silicon nitride, aluminum nitride, or another material, in some embodiments. In some embodiments, the passivating layer 112 formed by an ALD process may be an insulating layer.

In another embodiment, the passivating layer 112 may be formed by a Langmuir-Blodgett technique. The passivating layers 112 formed by a Langmuir-Blodgett technique may include a layer of molecules with a polar group at one end adjacent to the surface of the conducting interconnecting structures 106, 108, an organic chain attached to the polar group and extending way from the surface of the conductive interconnecting structures, and a non-polar group attached to the organic chain at the end of the molecule opposite that of the polar group. In an embodiment, the passivating layer may comprise an alkanethiol, having a carbon chain with a chain length between about 12 and about 20, and amines connected to the chain, although other materials may be used. In some embodiments, the passivating layer 112 formed by a Langmuir-Blodgett technique may be a monolayer of molecules. In other embodiments, the passivating layer 112 formed by a Langmuir-Blodgett technique may be a bi-layer, or have additional layers. In an embodiment, the passivating layer 112 formed by a Langmuir-Blodgett technique may be an insulating layer.

The stacked integrated circuit 100 of FIG. 1 may be connected to other devices. For example, the stacked integrated circuit 100 may be packaged and connected to a circuit board. The circuit board may connect the stacked integrated circuit 100 to other components. The stacked integrated circuit 100, circuit board, and other components may together form a computer system, with input and output devices, a processor, and memory. The stacked integrated circuit 100 may also be combined with other components to form other devices.

Figure 2:
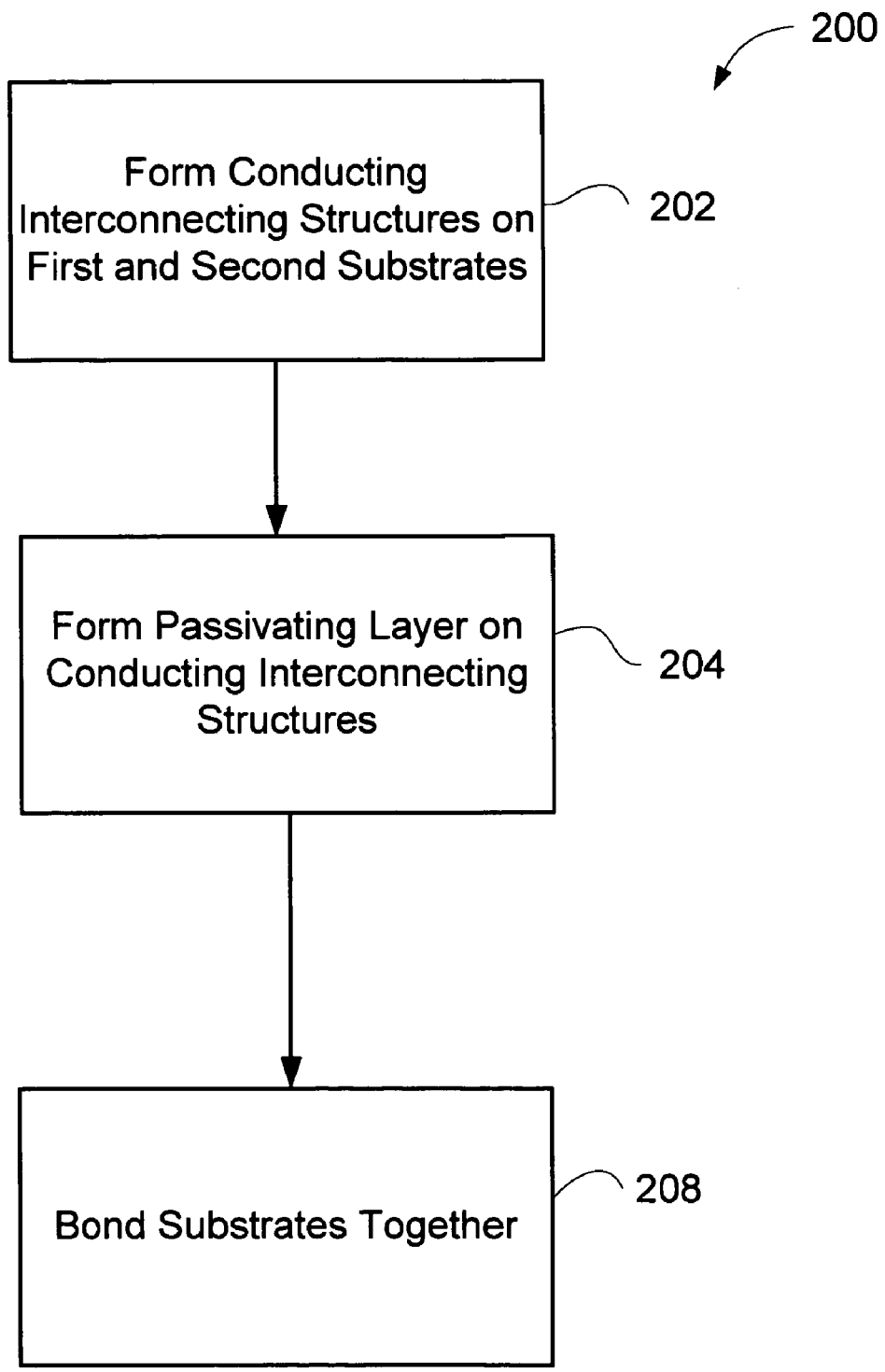
FIG. 2 is a flow chart that illustrates a method of fabricating the stacked integrated circuit according to one embodiment.

FIG. 2 is a flow chart 200 that illustrates a method of fabricating the stacked integrated circuit 100 according to one embodiment. The conducting interconnecting structures 106, 108 may be formed 202. The conducting interconnecting structures 106, 108 may be formed 202 as part of fabricating the first and second substrates 102, 104. In an embodiment, the conducting interconnecting structures 106, 108 comprise copper, although, as described above, the conducting interconnecting structures 106, 108 may be made of many other materials. As mentioned above, the first and second substrates 102, 104 may include different layers and devices, such as transistors, capacitors, etc. Any suitable method may be used to form the substrates 102, 104 and the conducting interconnecting structures 106, 108, and the conducting interconnecting structures 106, 108 may be formed 202 at any suitable time during formation of the various structures of the substrates 102, 104. In some embodiments, the substrates 102, 104 may be formed along with many other substrates as part of one or more wafers. The substrates 102, 104 may then be singulated from the wafer(s).

The passivating layer 112 may be formed 204 on the conducting interconnecting structures 106, 108 in an embodiment. In one embodiment, the passivating layer 112 is formed by an ALD process. In another embodiment, the passivating layer 112 is formed by an L-B technique. In yet other embodiments, other methods or combinations of methods may be used. In an embodiment, passivating layer 112 may be formed 204 on the substrates 102, 104 prior to singulation of the substrates 102, 104 from the wafer(s) of which they are part, while in other embodiments, the passivating layer 112 may be formed 204 after singulation.

In an embodiment, after forming 204 the passivating layer 112 the substrates may be bonded 208 together. The first substrate 102 and the second substrate 104 may be aligned over each other such that the passivating layers 112 are aligned over one another for optimal bonding. In one embodiment, a conventional alignment system is used to align the substrates 102 and 104 over each other so that the passivating layers 112 on each of the respective substrates 102, 104 are aligned over each other prior to bonding. The alignment system may include mechanical and/or photographical alignment markers. For example, alignment markers may be printed, embossed, punched, or otherwise indicated on each of the substrate 102 and 104 in precise locations. The substrate 102 and 104 may be adjusted so that the locations are in alignment with each other prior to bonding.

The conducting interconnecting structures 106, 108 of the substrates 102 and 104 may then be bonded together through the passivating layers 112, forming the stacked integrated circuit 100. At least portions of the conducting interconnecting structures 106, 108 may contact each other at the conclusion of the bonding 208 operation, rather than being separated by the passivating layer 112.

Any suitable bonding operation may be used. In an embodiment, thermo compression bonding may be used to bond 208 the substrates 102, 104. The bonding temperature, pressure, and duration of a thermo compression bonding operation may be chosen to be appropriate to the material of the conducting interconnecting structures 106, 108, and the thickness and composition of the passivating layer 112. In one embodiment, the bonding of the substrates 102, 104 may occur at a bonding temperature between about 200-400° C., and at a pressure less than about 10 mega Pascal. In this embodiment, bonding may occur for a duration of 0.5-3 hours.

Similarly to forming the passivating layer 112, in an embodiment, the substrates 102, 104 may be bonded 208 together prior to singulation of the substrates 102, 104 from the wafer(s) of which they are part. In other embodiments, the substrates 102, 104 may be bonded 208 after singulation.

In another embodiment, the substrates 102, 104 may be bonded 208 together prior to forming 204 the passivating layer 112. In such an embodiment, the passivating layer 112 would only be formed on the surfaces of the conducting interconnecting structures 106, 108 extending between the substrates 102, 104. Thus, the passivating layer 112 would not be formed 204 on the bonding surfaces (the surfaces of the conducting interconnecting structures 106, 108 that are furthest from the substrates 102, 104 and/or that are bonded together) of the conducting interconnecting structures 106, 108.

Figure 3:
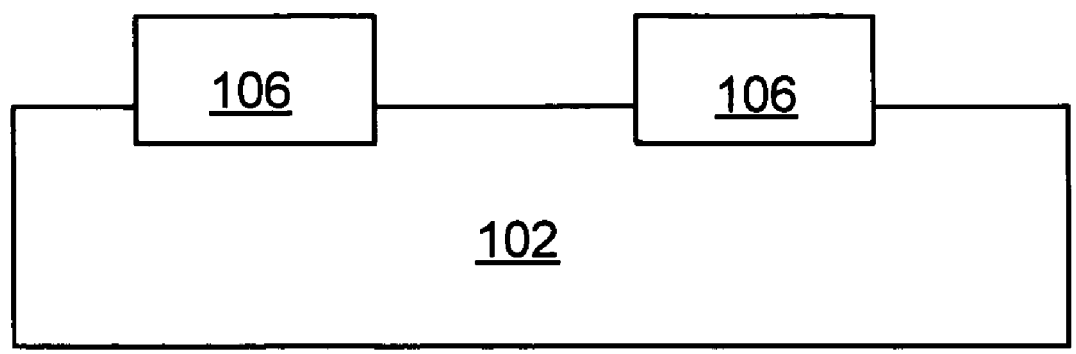
FIG. 3 is a cross-sectional side view that illustrates the first substrate after formation of the conducting interconnecting structures.

FIGS. 3 through 8 are cross-sectional side views that illustrate various stages in the formation of the stacked integrated circuit 100 according to some embodiments as described in the flow chart of FIG. 2. FIG. 3 is a cross-sectional side view that illustrates the first substrate 102 after formation 202 of the conducting interconnecting structures 106. As described above, any suitable method may be used to fabricate the first substrate 102, including the conducting interconnecting structures 106.

Figure 4:
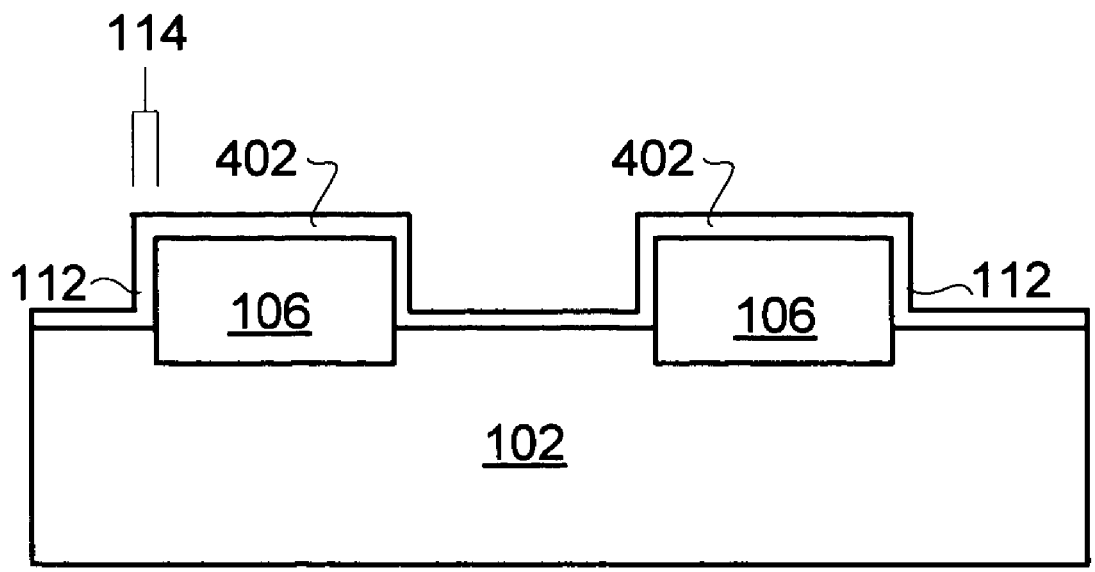
FIG. 4 is a cross-sectional side view that illustrates the first substrate after formation of a passivating layer by a Langmuir-Blodgett technique.

FIG. 4 is a cross-sectional side view that illustrates the first substrate 102 after formation 204 of a passivating layer 112 by a Langmuir-Blodgett technique, according to one embodiment. As described above, the passivating layer 112 formed by a Langmuir-Blodgett technique may include a layer of molecules with a polar group at one end adjacent to the surface of the conducting interconnecting structures 106, 108, an organic chain attached to the polar group and extending way from the surface of the conductive interconnecting structures, and a non-polar group attached to the organic chain at the end of the molecule opposite that of the polar group. The passivating layer 112 resulting from such a formation method may have a thickness 114 of one molecular monolayer 402.

Figure 5A:
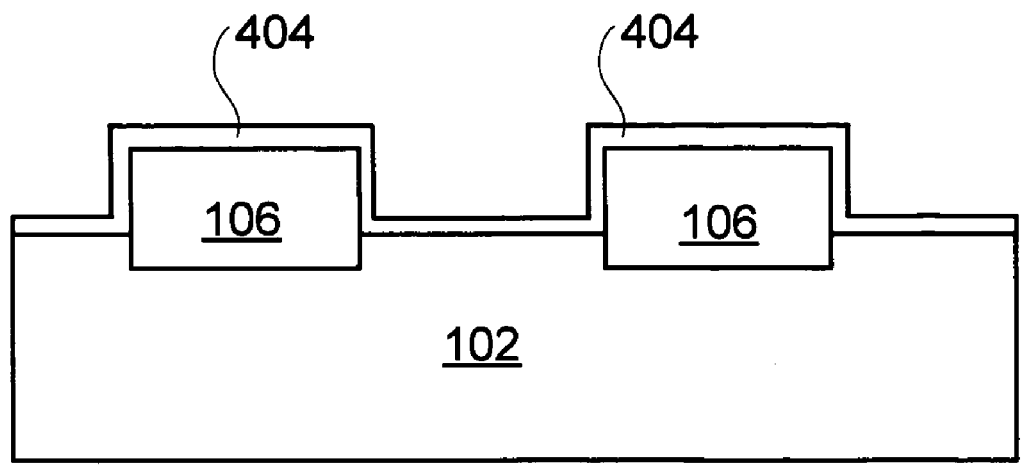
FIGS. 5a and 5b are cross-sectional side views that illustrate the first substrate during formation of a passivating layer by an atomic layer deposition process.
Figure 5B:
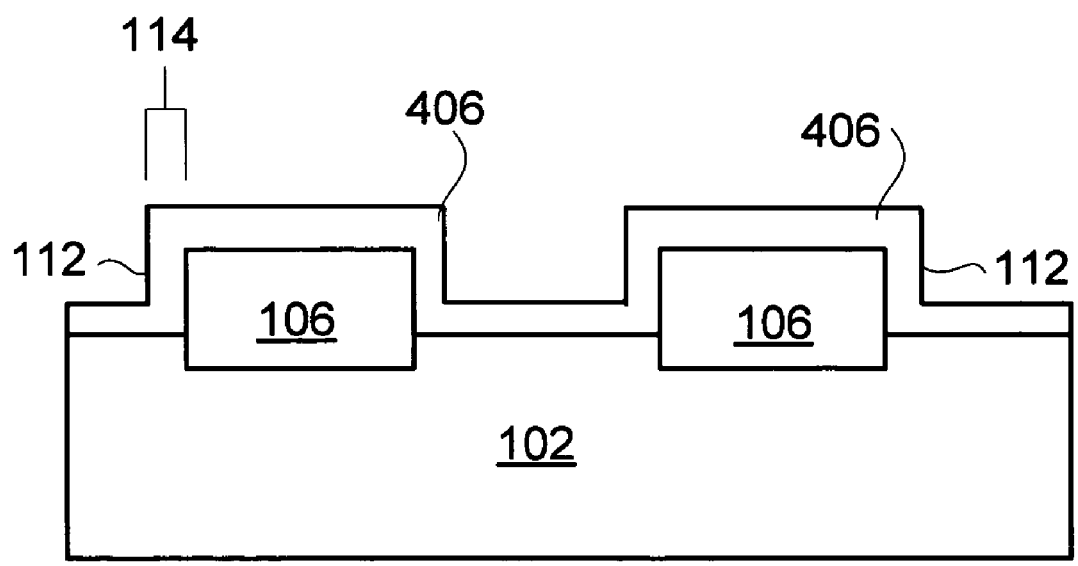

FIGS. 5a and 5b are cross-sectional side views that illustrate the first substrate 102 during formation 204 of a passivating layer 112 by an atomic layer deposition process, according to one alternative embodiment. The ALD process may form 204 the passivating layer 112 by alternating pulses of precursors that adhere to the exposed surfaces in succession. For example, in an embodiment where the passivating layer 112 comprises aluminum oxide, a material containing an aluminum precursor (such as tri-methyl aluminum) may be introduced and adsorbed onto the exposed surface, as seen in FIG. 5a, which illustrates a first layer 404 of the first precursor. Then a material containing an oxygen species (such as $H_2O$) may be introduced, and result in formation of a layer 406 of the passivating material ($Al_2O_3$ in the current example) that forms the passivating layer 112, illustrated in FIG. 5b. The two different precursor types may be introduced repeatedly in succession until a passivating layer 112 of a desired thickness 114 is formed, as illustrated in FIG. 5b.

Figure 6:
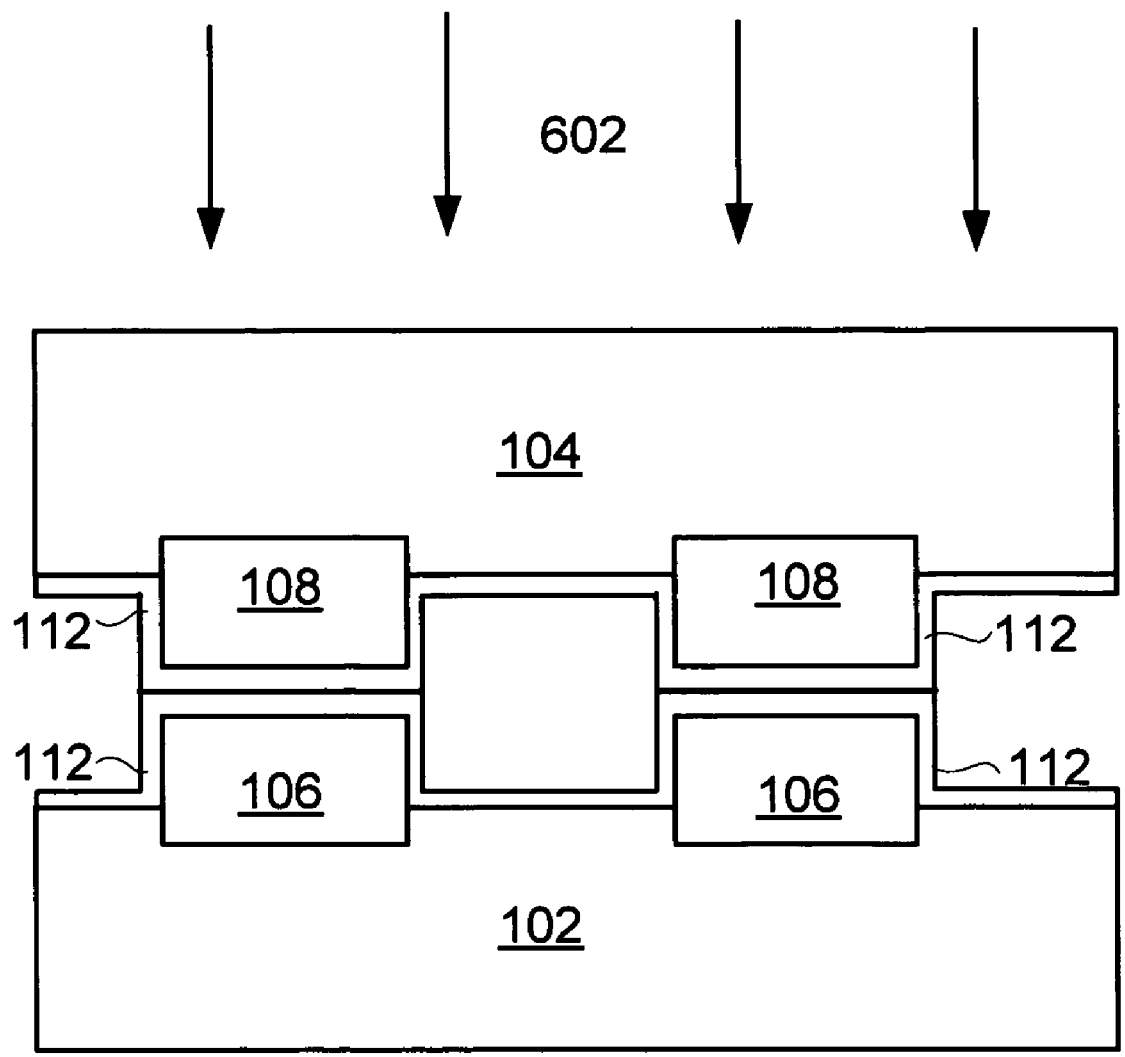
FIG. 6 is a cross-sectional side view that illustrates the first substrate being bonded to the second substrate.

FIG. 6 is a cross-sectional side view that illustrates the first substrate 102 being bonded 208 to the second substrate 104, according to one embodiment where the bonding 208 is done by a thermo compression bonding process. As illustrated in FIG. 6, the substrates 102, 104 have been aligned, and temperature and pressure 602 are applied to form a bond between the conducting interconnecting structures 106 of the first substrate 102 and the conducting interconnecting structures 108 of the second substrate 104. Also as shown in FIG. 6, at the beginning of the bonding process, there may be a sharp boundary between the passivating layers 112 of the first and second substrates 102, 104.

Bonding 208 creates an electrical connection between the two sets of conducting interconnecting structures 106, 108 and mechanically joins the substrates 102, 104. FIG. 1 illustrates an embodiment of a stacked integrated circuit 100 that may be the result of the bonding 208 illustrated in FIG. 6.

Figure 7:
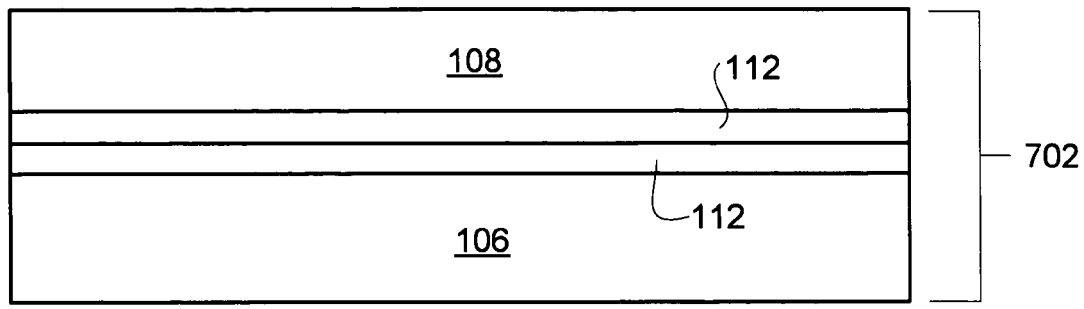
FIG. 7 is a cross-sectional side view that illustrates the separate conducting interconnecting structures of the first and second substrates and their separate passivating layers.

FIG. 7 is a cross-sectional side view that illustrates the separate conducting interconnecting structures 106, 108 of the first and second substrates 102, 104 and their separate passivating layers 112, according to an embodiment. The portions of the separate conducting interconnecting structures 106, 108 and the passivating layers 112 make up a region 702 that will become the bonded region 110 after the bonding operation in an embodiment. As seen in FIG. 7, there is a distinct boundary between the separate passivating layers 112 and conducting interconnecting structures 106, 108.

Figure 8:
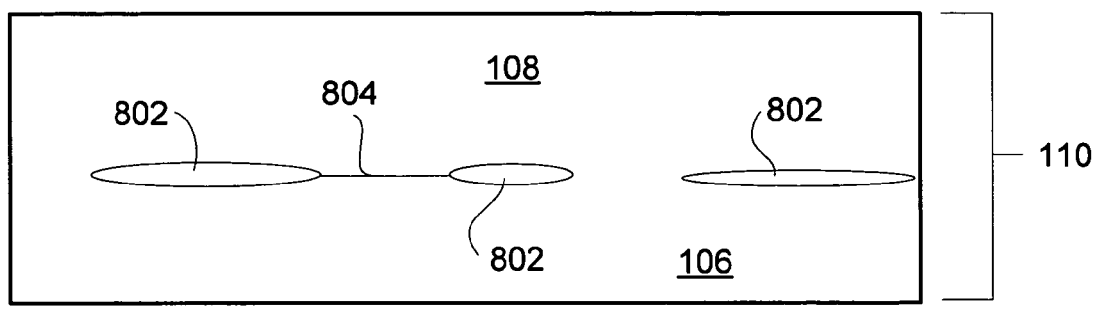
FIG. 8 is a cross-sectional side view that illustrates the bonded region of FIG. 1 in more detail.

FIG. 8 is a cross-sectional side view that illustrates the bonded region 110 of FIG. 1 in more detail, according to one embodiment. As seen in FIG. 8, the distinct boundary has partially disappeared after bonding. In some embodiments, the boundary between conducting interconnecting structures 106, 108 may have partially or entirely disappeared. In another embodiment, the boundary may remain, but there may be electrical contact between the conducting interconnecting structures 106, 108. In the embodiment illustrated in FIG. 8, a part 804 of the boundary remains after the bonding operation, although conducting interconnecting structures 106, 108 are no longer fully separated by a distinct boundary. Also, rather than having continuous passivating layers 112 separating the conducting interconnecting structures 106, 108, there may be regions 802 of passivating material in the bonded region 110 between the conducting interconnecting structures 106, 108 (passivating material is the material of which the passivating layer was comprised). In other embodiments, some of the passivating material may have diffused through a portion of the conducting interconnecting structures 106, 108.

Figure 9:
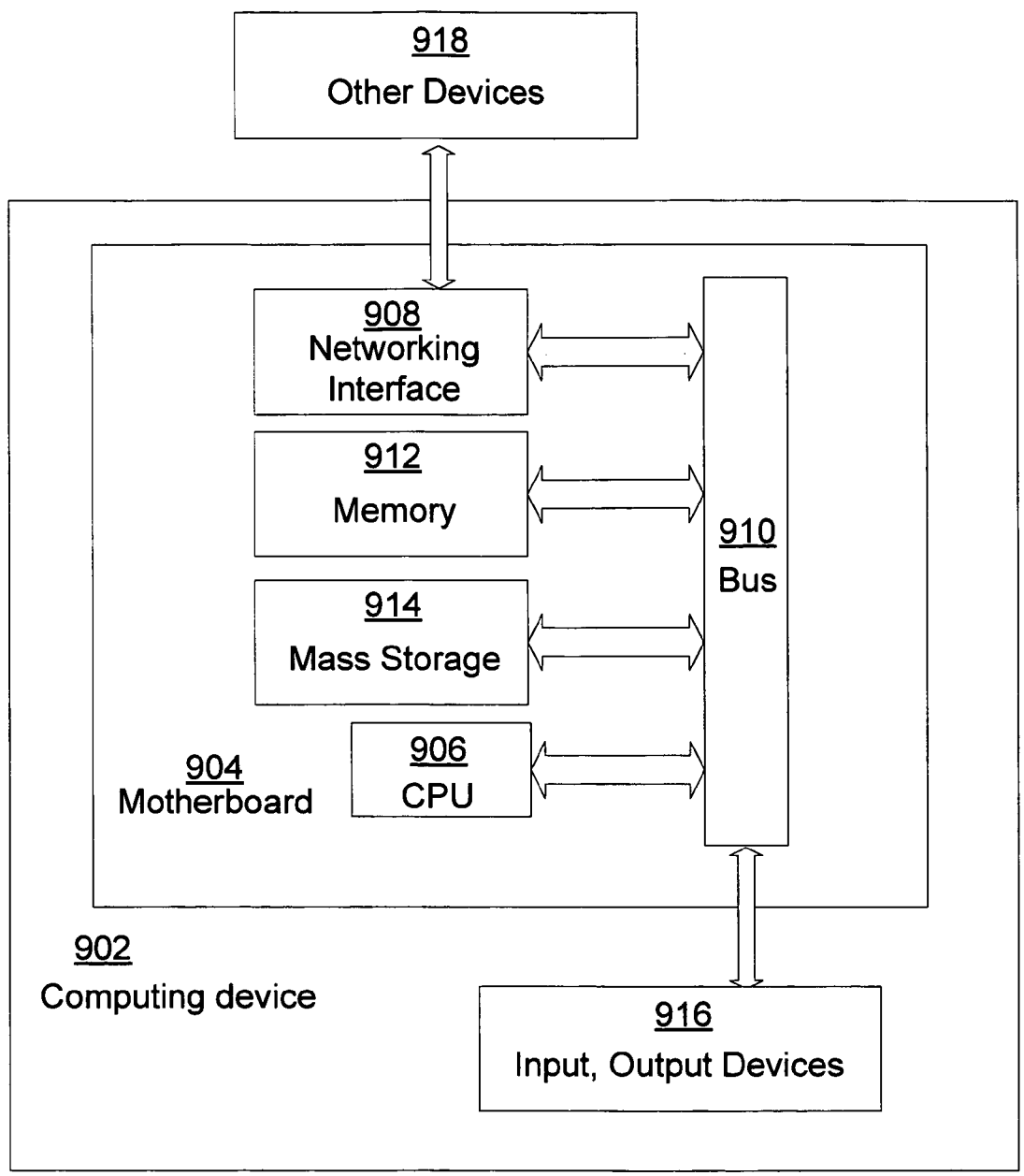
FIG. 9 illustrates a system in accordance with one embodiment of the present invention.

FIG. 9 illustrates a system 900 in accordance with one embodiment of the present invention. One or more devices that include a stacked integrated circuit 100 as described above may be included in the system 900 of FIG. 9. As illustrated, for the embodiment, system 900 includes a computing device 902 for processing data. Computing device 902 may include a motherboard 904. Coupled to or part of the motherboard 904 may be in particular a processor 906, and a networking interface 908 coupled to a bus 910. A chipset may form part or all of the bus 910. The processor 906, chipset, and/or other parts of the system 900 may include or be a stacked integrated circuit 100 as described above.

Depending on the applications, system 900 may include other components, including but are not limited to volatile and non-volatile memory 912, a graphics processor (integrated with the motherboard 904 or connected to the motherboard as a separate removable component such as an AGP or PCI-E graphics processor), a digital signal processor, a crypto processor, mass storage 914 (such as hard disk, compact disk (CD), digital versatile disk (DVD) and so forth), input and/or output devices 916, and so forth.

In various embodiments, system 900 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method, comprising:
    forming a first passivating layer on conductive interconnecting structures of a first substrate, using a process chosen from a group consisting of an atomic layer deposition process and a Langmuir-Blodgett technique;
    forming a second passivating layer on conductive interconnecting structures of a second substrate, using a process chosen from a group consisting of an atomic layer deposition process and a Langmuir-Blodgett technique;
    aligning the first substrate to the second substrate so that the conductive interconnecting structures of the first and second substrates are in physical contact but are separated by the first and second passivating layers; and
    thermo compression bonding the first substrate to the second substrate, thereby causing the conductive interconnecting structures of the first and second substrates to make electrical contact through the passivating layers.

2. The method of claim 1, wherein forming the passivating layer on conductive interconnecting structures of the first substrate comprises forming the passivation layer by an atomic layer deposition process and wherein the passivating layer is an insulating layer.

3. The method of claim 2, wherein forming the passivating layer on conductive interconnecting structures of the second substrate comprises forming the passivation layer by Langmuir-Blodgett technique.

4. The method of claim 1, wherein at least some of the material of the passivating layers between the conductive interconnecting structure of the first substrate and the conductive interconnecting structure of the second substrate prior to bonding remains in a bonded region between the conductive interconnecting structure of the first substrate and the conductive interconnecting structure of the second substrate after bonding.

5. The method of claim 1, wherein the passivating layers have a thickness less than about 30 angstroms.

6. The method of claim 1, wherein the passivating layers are formed by a Langmuir-Blodgett technique and substantially consists of a monolayer of molecules.

7. The method of claim 1, wherein the passivating layers are formed by a Langmuir-Blodgett technique and is formed after bonding the first substrate to the second substrate.

* * * * *